US012599010B2

(12) United States Patent (10) Patent No.: US 12,599,010 B2

Manepalli et al. (45) Date of Patent: Apr. 7, 2026

(54) MICROELECTRONIC PACKAGES WITH EMBEDDED INTERPOSERS

(71) Applicant: Intel Corporation, Santa Clara, CA (US)

(72) Inventors: Rahul N. Manepalli, Chandler, AZ (US); Hamid Azimi, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 1042 days.

(21) Appl. No.: 17/481,733

(22) Filed: Sep. 22, 2021

(65) Prior Publication Data

US 2023/0094820 A1     Mar. 30, 2023

(51) Int. Cl.
*H01L 23/538*        (2006.01)
*H01L 21/56*         (2006.01)
*H01L 23/00*         (2006.01)

(52) U.S. Cl.
CPC ........ *H01L 23/5389* (2013.01); *H01L 21/568* (2013.01); *H01L 23/5385* (2013.01); *H01L 24/24* (2013.01); *H01L 24/82* (2013.01); *H01L 2224/24011* (2013.01); *H01L 2224/2402* (2013.01); *H01L 2224/24137* (2013.01); *H01L 2224/82005* (2013.01); *H01L 2224/82101* (2013.01); *H01L 2224/82106* (2013.01)

(58) Field of Classification Search
None
See application file for complete search history.

(56) References Cited

U.S. PATENT DOCUMENTS

| | | | | |
|---|---|---|---|---|
| 10,593,628 | B2 * | 3/2020 | Bhagavat | .............. H01L 23/522 |
| 10,923,430 | B2 * | 2/2021 | Lin | ...................... H01L 25/0655 |
| 11,901,248 | B2 * | 2/2024 | Sankman | ............ H01L 21/6835 |
| 2013/0168857 | A1 | 7/2013 | Gregorich et al. | |
| 2013/0277829 | A1 | 10/2013 | Yee et al. | |
| 2014/0321803 | A1 * | 10/2014 | Thacker | .............. H01L 25/0655 |
| | | | | 385/14 |
| 2015/0235991 | A1 | 8/2015 | Gu et al. | |
| 2015/0262928 | A1 | 9/2015 | Shen et al. | |
| 2015/0279817 | A1 | 10/2015 | Zhang et al. | |
| 2017/0186660 | A1 | 6/2017 | Lim et al. | |
| 2018/0122736 | A1 | 5/2018 | Hu | |

(Continued)

OTHER PUBLICATIONS

PCT International Search Report and Written Opinion in PCT International Application Serial No. PCT/US2022/074827 mailed on Nov. 21, 2022 (9 pages).

(Continued)

*Primary Examiner* — Nishath Yasmeen
(74) *Attorney, Agent, or Firm* — Alliance IP, LLC

(57)     ABSTRACT

An electronic device comprises multiple integrated circuit (IC) dice disposed on a package substrate having a substrate area, a mold layer that includes the IC dice, and multiple conductive pillars extending from a surface of at least one IC die to a first surface of the mold layer, and an interposer layer extending over the substrate area and comprised of a stiffening material more rigid than a material of the package substrate. The interposer layer includes multiple electrically conductive through layer vias contacting the conductive pillars at a first surface of the mold layer and extending through the stiffening material to a second surface of the interposer layer.

11 Claims, 6 Drawing Sheets

(56)                References Cited

U.S. PATENT DOCUMENTS

2019/0109117  A1      4/2019  Fang et al.
2019/0341320  A1*   11/2019  Pollard ................. H01L 21/561
2021/0005542  A1*    1/2021  Mallik ................ H01L 23/5384
2021/0005556  A1*    1/2021  Yu ............................ H01L 25/50
2021/0028080  A1*    1/2021  Pietambaram .... H01L 23/49503
2021/0134781  A1      5/2021  Chan et al.
2021/0305108  A1*    9/2021  Sankman ........... H01L 21/4857

OTHER PUBLICATIONS

EPO European Extended Search Report in EP Application Serial
No. 22873762.3 mailed on May 12, 2025, 16 pages.

* cited by examiner

MICROELECTRONIC PACKAGES WITH EMBEDDED INTERPOSERS

TECHNICAL FIELD

Embodiments pertain to packaging of integrated circuits (ICs). Some embodiments relate to IC package interconnection of integrated circuits.

BACKGROUND

Electronic systems often include integrated circuits (ICs) that are interconnected and packaged as a subassembly. It is desired to integrate multiple types of IC dice into a single package to create an efficient system in a package. However, as packaged electronic systems become larger due to adding more IC dice, the area form factor (e.g., X-Y dimensions) of the packages becomes larger. If the area form factor of a package becomes too large, the package can be susceptible to warping. Thus, there are general needs for devices, systems and methods that address the size challenges for interconnection and packaging of IC systems and yet provide a robust design.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

To meet the demand for increased functional complexity in smaller devices, manufacturers integrate multiple types of IC dice in a single electronic package to create an efficient electronic system in a package. The current package technologies for electronic packaging are limited in the area form factor (e.g., XY dimension) that can be achieved due to warping. The susceptibility to warping limits the number of IC dice that can be included in multi-dice assemblies and limits the size of an electronic package.

A package stiffener can be used to make the electronic package less susceptible to warping, but package stiffeners are typically limited to the periphery or edges of the electronic package and only reduce the susceptibility of the package edges to warping. An ultra-thin core (UTC) package can reduce susceptibility to warping but the thickness (Z-dimension) of the package increases with the increase in form factor (X-Y dimensions) of the electronic package.

Figure 1:
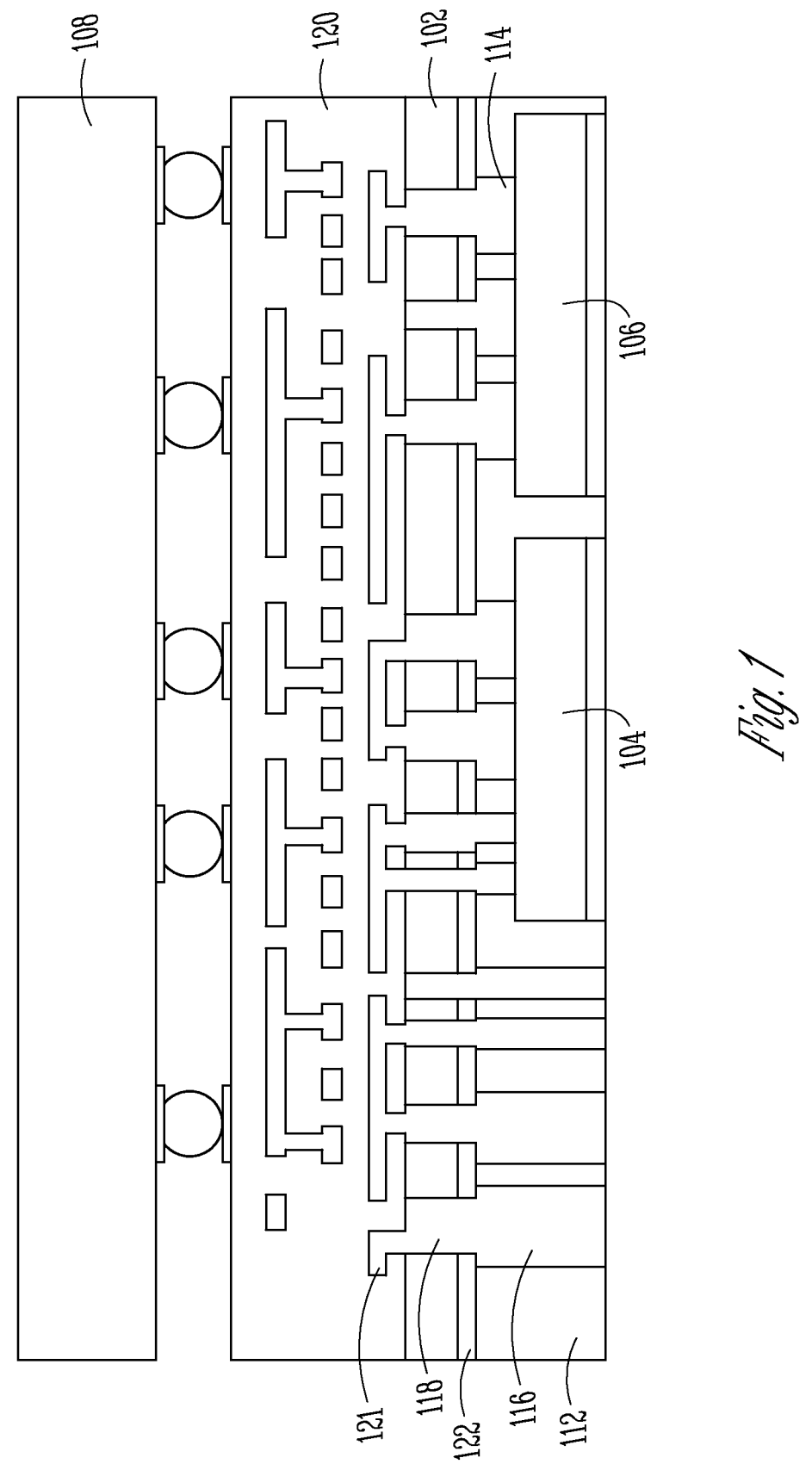
FIG. 1 is an illustration of an example of an electronic system in accordance with some embodiments.

FIG. 1 is an illustration of an example of an electronic system with improved robustness with regard to package warping. The electronic system includes an interposer layer 102. The interposer layer 102 reduces the susceptibility of the entire electronic package to warping and provides interconnect between devices of the packaged electronic system.

The electronic system includes multiple IC dice (104, 106) and a package substrate 108. Only two IC dice are shown in the example for simplicity, and an actual implementation may have many IC dice. The package substrate 108 may be made of silicon, glass, metal, or an organic core material. The electronic system includes a mold layer 112. In the example of FIG. 1, the connections to the dice are upward toward the mold layer 112, but in certain examples, the package substrate 108 may include a layer of interconnect having electrically conductive traces to provide electrical connection between the IC dice.

The interposer layer 102 is made of a stiffening material more rigid than the material used for the package substrate 108. The interposer layer 102 extends substantially over the same area as the package substrate 108 and therefore reduces the susceptibility of the whole electronic package to warping and not just the edges of the package. In some examples, the stiffening material is glass and the interposer layer 102 is a glass interposer layer. The glass may be a silicate-based glass (e.g., lithium-silicate, borosilicate, aluminum silicate, etc.) or other glass. In some examples, the interposer layer 102 is made of a metal more rigid than the material of the package substrate 108. In some examples, the interposer layer 102 is made of a ceramic.

The IC dice may be embedded or encapsulated in the mold layer 112. The mold layer includes electrically conductive pillars (e.g., metal pillars). Some conductive pillars 114 extend from an IC die to the upper surface of the mold layer, and some conductive pillars 116 extend through the mold layer 112 from the bottom surface at or near the package substrate 108 to the upper surface of the mold layer 112.

The interposer layer 102 includes electrically conductive through layer vias 118. The through layer vias 118 extend through the interposer layer 102. If the interposer layer 102 is a glass interposer layer, the through layer vias 118 are through glass vias (TGVs). If the interposer layer 102 is a metal interposer layer, the through layer vias may include a coating of insulating material (e.g., an insulating dielectric material) to electrically insulate the conductive material of the through layer via from the metal interposer material. The through layer vias 118 of the interposer layer 102 contact the conductive pillars (114, 116) of the mold layer and extend to the upper surface of the interposer layer 102.

The electronic system includes a redistribution layer (RDL) 120. The RDL 120 includes one or more layers of electrically conductive interconnect 121 to electrically interconnect the different devices of the electronic system. The interconnect contacts the through layer vias 118. Although the example of FIG. 1 shows the interposer layer 102 as a separate layer below the RDL 120, the interposer layer 102 may be positioned above the RDL 120, or the interposer layer 102 may be embedded in the RDL 120 or otherwise included as part of the RDL 120.

In the example of FIG. 1, the electronic system includes an adhesive layer 122 arranged between the mold layer 112 and the interposer layer 102. The through layer vias 118 extend through the adhesive layer 122 to the conductive pillars 114, 116 of the mold layer 112. The adhesive layer 122 can be used to attach the interposer layer 102 to the mold layer 112, and to align the through layer vias 118 with the conductive pillars 114, 116.

In some examples, each through layer via 118 includes solder on both ends of the through layer via 118. The interposer layer 102 may be pre-formed with the through layer vias 118 already drilled (or etched) and filled with conductive material (e.g., copper, aluminum, etc.), and solder balls attached to the ends of the through layer vias 118 before mounting on the mold layer 112.

Because the interposer covers the entire area (or substantially the entire area) of the package substrate 108, significant improvement in package warpage is achieved, both at room temperature and at higher temperature, thereby enabling manufacture of electronic systems with much larger XY form factors. The low thermal expansion coefficient of glass makes the interposer compatible with package substrates made of glass or ceramic. The thickness of the interposer layer 102 can be chosen based on the XY form factor needed in the final electronic package.

Figure 2:
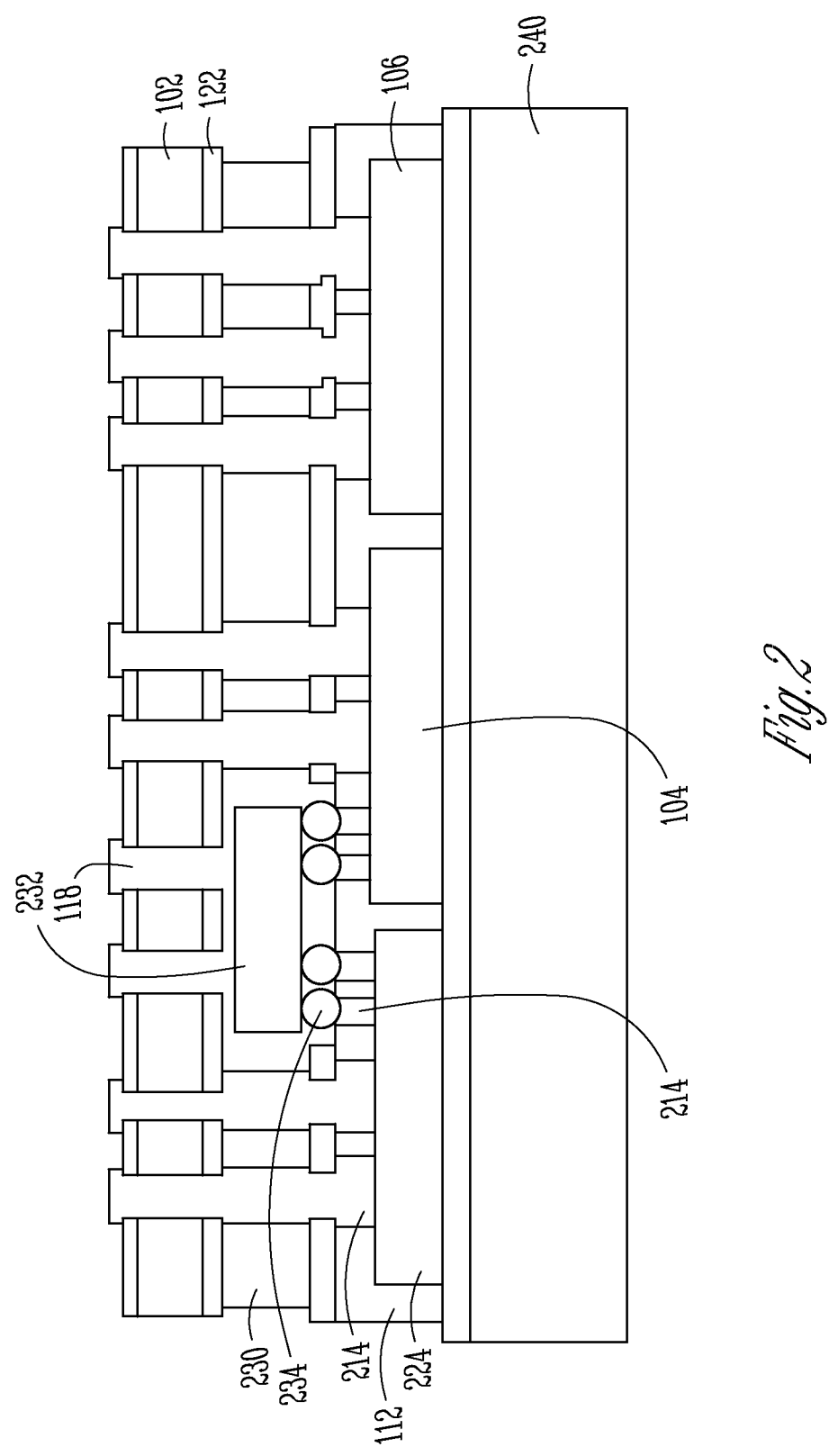
FIG. 2 is an illustration of another example of an electronic system in accordance with some embodiments.

FIG. 2 is an illustration of another example of an electronic system with reduced susceptibility to warping. As in the example of FIG. 1, the electronic system includes a carrier layer 240, mold layer 112, an interposer layer 102, and an adhesive layer 122. The example of FIG. 2 includes an additional IC die 224 and an insulating layer 230 arranged between the mold layer 112 and the interposer layer 102. The insulating layer 230 may be an additional mold layer. An electronic device 232 is arranged between the mold layer 112 and the interposer layer 102. The electronic device 232 is also in electrical contact with the through layer vias 118 of the interposer layer 102. The mold layer 112 includes conductive pillars 214 extending from the IC pads to the insulating layer 230 and the electronic device 232 is in electrical contact with IC dice 104, 224 (e.g., using solder 234).

In some examples, the electronic device 232 is a die-to-die bridge that provides electrical continuity between at least two of the IC dice. The die-to-die bridge may also provide electrical continuity between an RDL (e.g., RDL 120 in FIG. 1) and one or more of the IC dice. In some examples, the electronic device 232 includes a capacitor to filter electrical signals passed among the IC dice and the RDL. In some examples, the electronic device 232 includes one or more active electronic devices or circuits. The insulating layer 230 can include through vias 236 that provide electrical contact to the through layer vias 118 of the interposer layer 102 and the conductive pillars 214 of the mold layer 112. The use of an interposer of appropriate thickness in the interconnection scheme of FIG. 2 results in a low warpage, ultra large die complex patch, which can then be attached to another level assembly at a looser pitch.

Figure 3A:
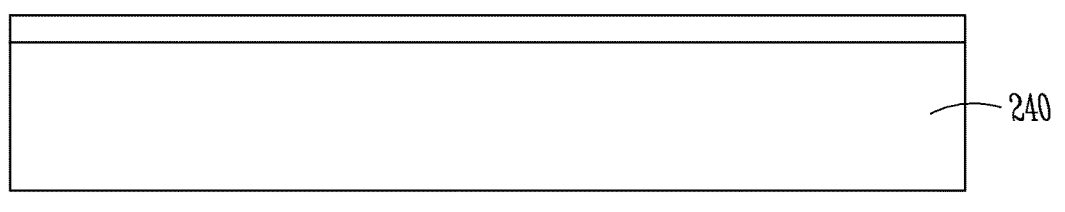
FIGS. 3A-3H illustrate a flow diagram of a method of manufacture of an electronic system in accordance with some embodiments.
Figure 3B:
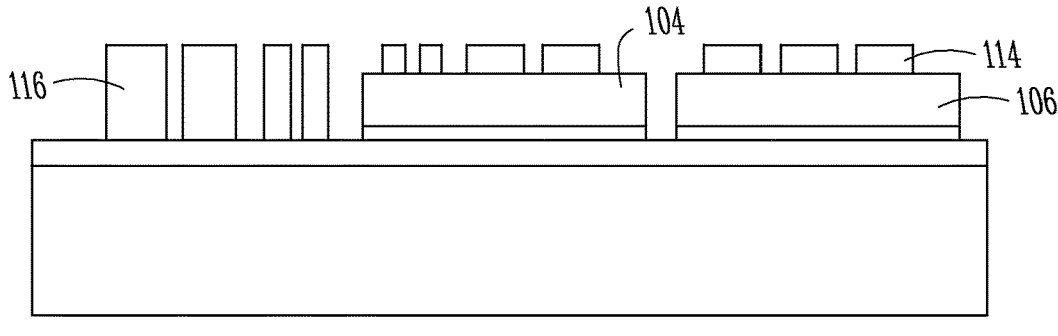
Figure 3C:
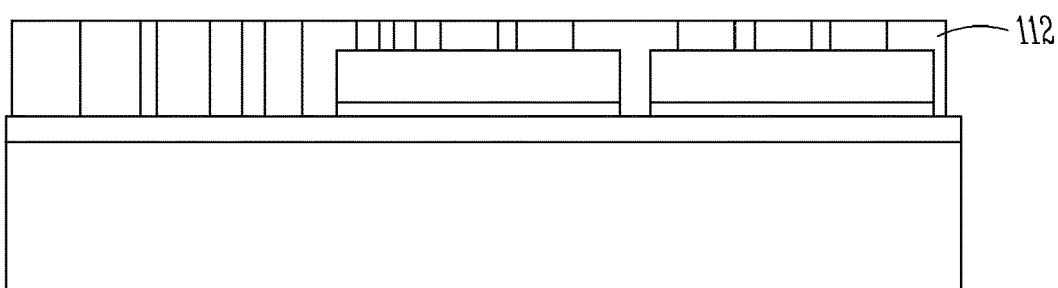

FIGS. 3A-3G illustrate a method of manufacture of an electronic system, such as the example electronic system of FIG. 1. FIG. 3A is an illustration of a carrier layer 240. The carrier layer 240 may be made of silicon, glass, metal, or an organic core material. In FIG. 3B, IC dice 104 and 106 are attached to the carrier layer 240 and conductive pillars 114, 116 are formed. In FIG. 3C, a mold layer 112 is added to form a dice complex that includes the IC dice 104, 106 and conductive pillars 114, 116. The mold layer 112 may be formed by a compression applied using a dispensing or injection process. The surface of the mold layer 112 may be prepared by grinding the compression mold.

Figure 3D:
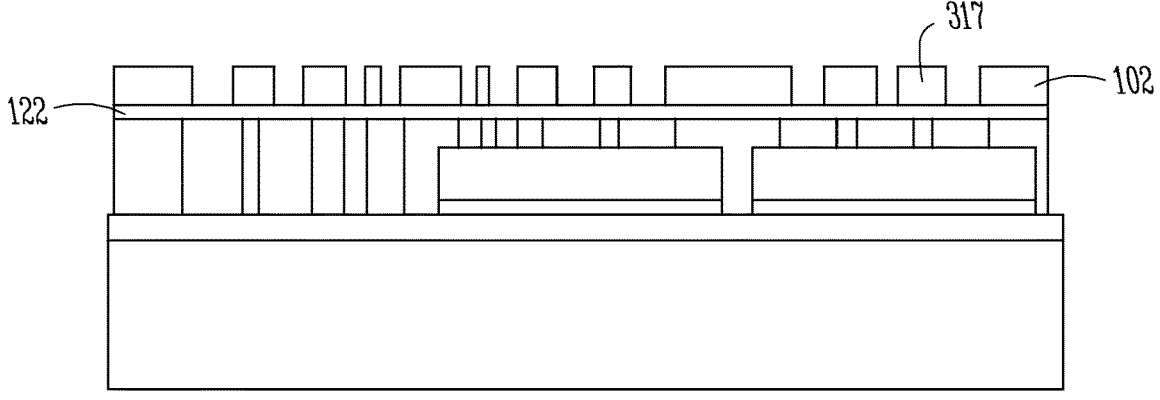

In FIG. 3D, an interposer 102 is laminated to the dice complex. The interposer 102 may be a glass interposer that may be pre-drilled with TGVs 118. The walls of the TGVs 118 may include seed metallization 317. The interposer 102 may be laminated using an adhesive layer 122. The adhesive layer may include a dielectric material. The attaching of the interposer 102 to the mold layer 112 may take place at the wafer level, or the individual dice complexes may be separated (e.g., by sawing) and the interposer 102 aligned and attached to the mold layer 112 at the unit level. The interposer 102 may also be attached at the panel level. The through layer vias 118 are aligned to the underlying pads of the ICs and conductive pillars so that a future interconnect (e.g., RDL layer 120) can be made to these pads and thru the through layer vias 118.

Figure 3E:
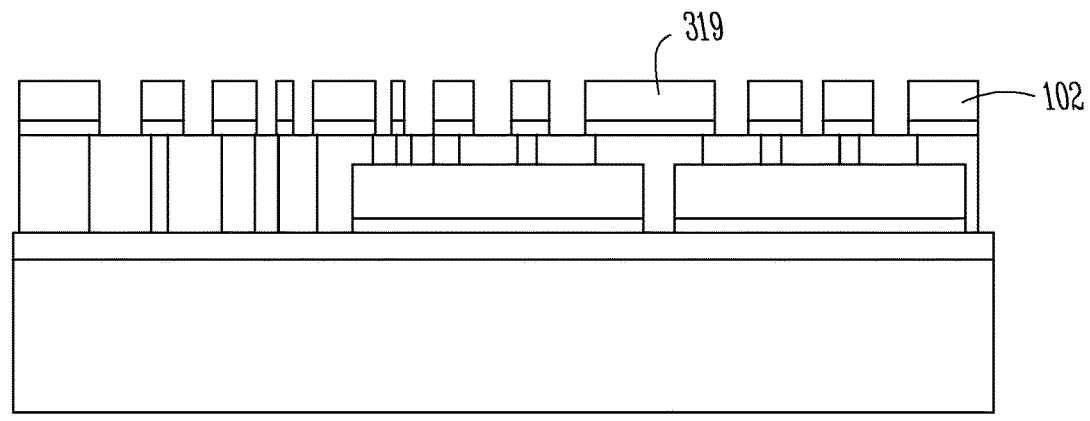

In FIG. 3E, the portion of the adhesive dielectric layer 122 between the through layer vias 118 and the conductive pillars and IC pads is removed using either dry etch processes or laser ablation processes. After the removal of the adhesive layer 122, the seed layer on the through layer via side walls is connected to the pads and pillars on the underlying die complex using a seed metallization process (e.g., either physical vapor deposition (PVD), or a de-smearing and electroless copper deposition). The top surface 319 of the interposer 102 may be seeded.

Figure 3F:
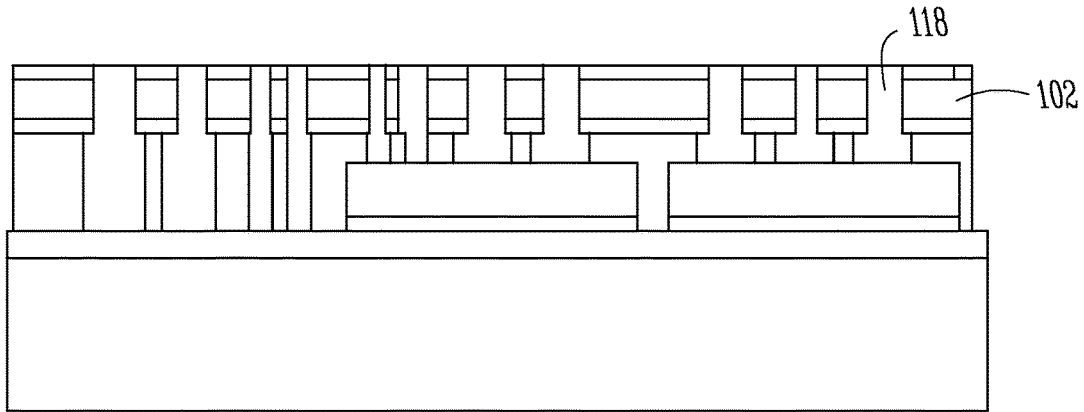

In FIG. 3F, the through layer vias 118 are filled and conductive interconnect added to the interposer 102, such as by patterning and electroplating for example, to produce a fully plated interconnect. The interposer 102 is now integrated into an embedded dice package.

Figure 3G:
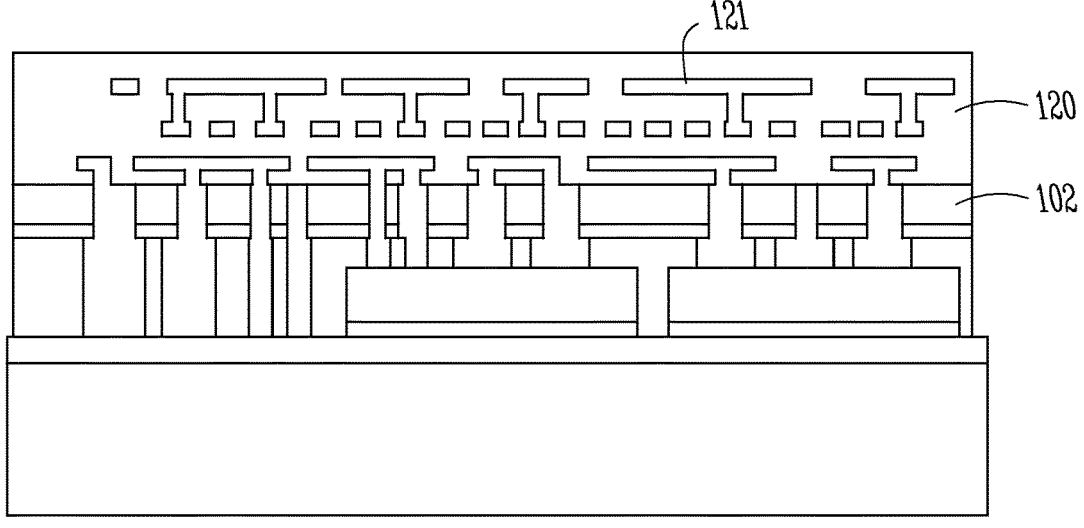

In FIG. 3G, the RDL 120 that contains additional routing layers of electrically conductive interconnect 121 is built up on the interposer 102 to further integrate the interposer 102 into the embedded dice package.

Figure 3H:
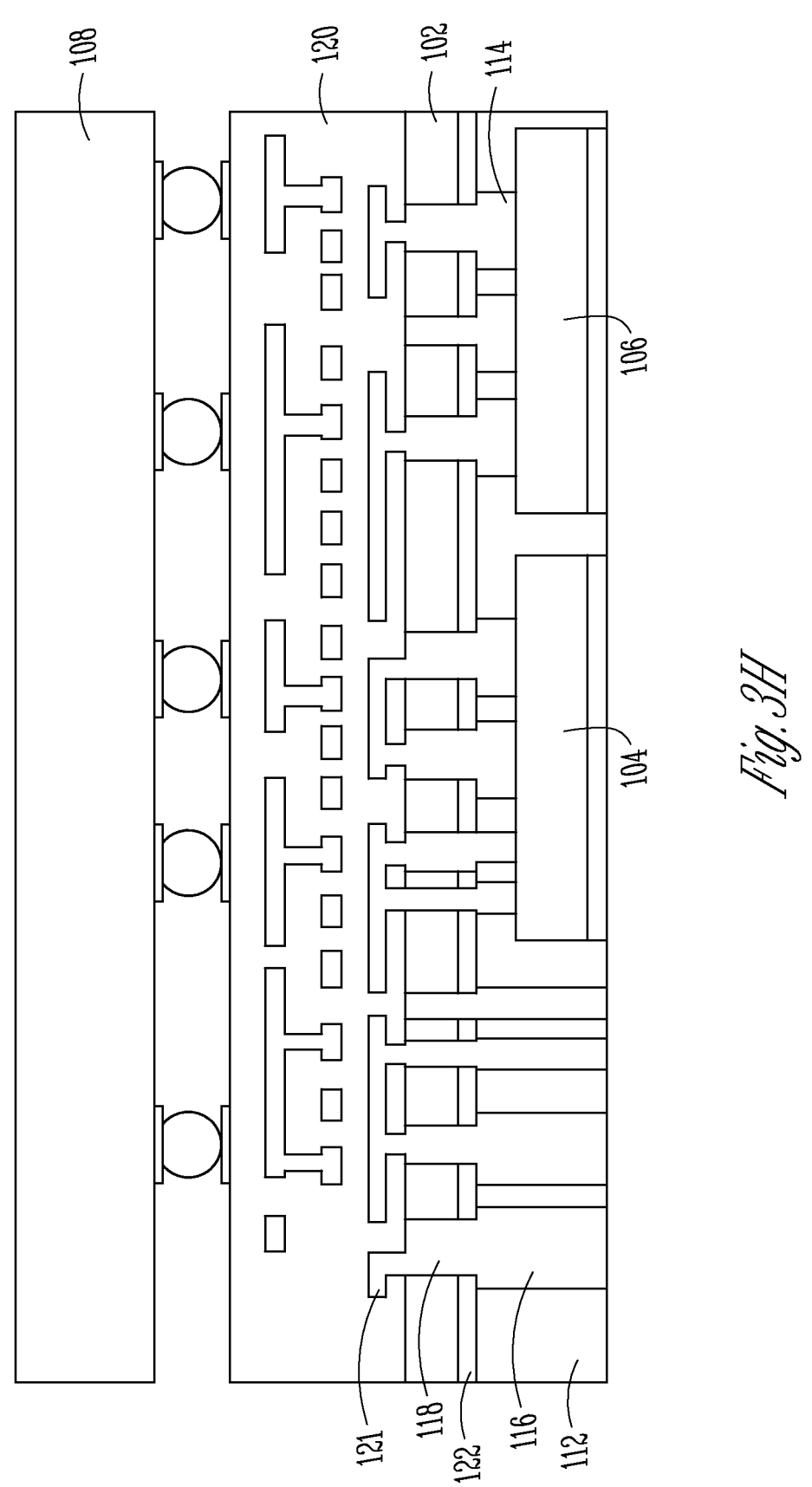

In FIG. 3H, the carrier layer 240 is removed. The RDL 120 is attached to a package substrate 108 (e.g., by attaching solder bumps or solder balls to bond pads of the RDL layer and substrate).

The interposer 102 can be embedded in any of the redistribution layers. For illustration purposes FIGS. 3D-3G shows the interposer 102 attached at the layer above the dice complex, however the interposer 102 can be embedded in any layer with optimum design considerations for package warpage.

Further, integrated passive components (e.g., thin film capacitors, inductors, die-to-die bridges) can be placed within or on the interposer 102 to enable more efficient power delivery schemes to the heterogenous electronic device. The process flow also allows for subsequent memory and or other device attach on top of the embedded die package (pillar interconnects), after release from the glass carrier. The process scheme shown in FIGS. 3A-3G enables a seamless integration of these additional components into an embedded die package.

An example of an electronic device using assemblies with system level packaging as described in the present disclosure is included to show an example of a higher level device application.

Figure 4:
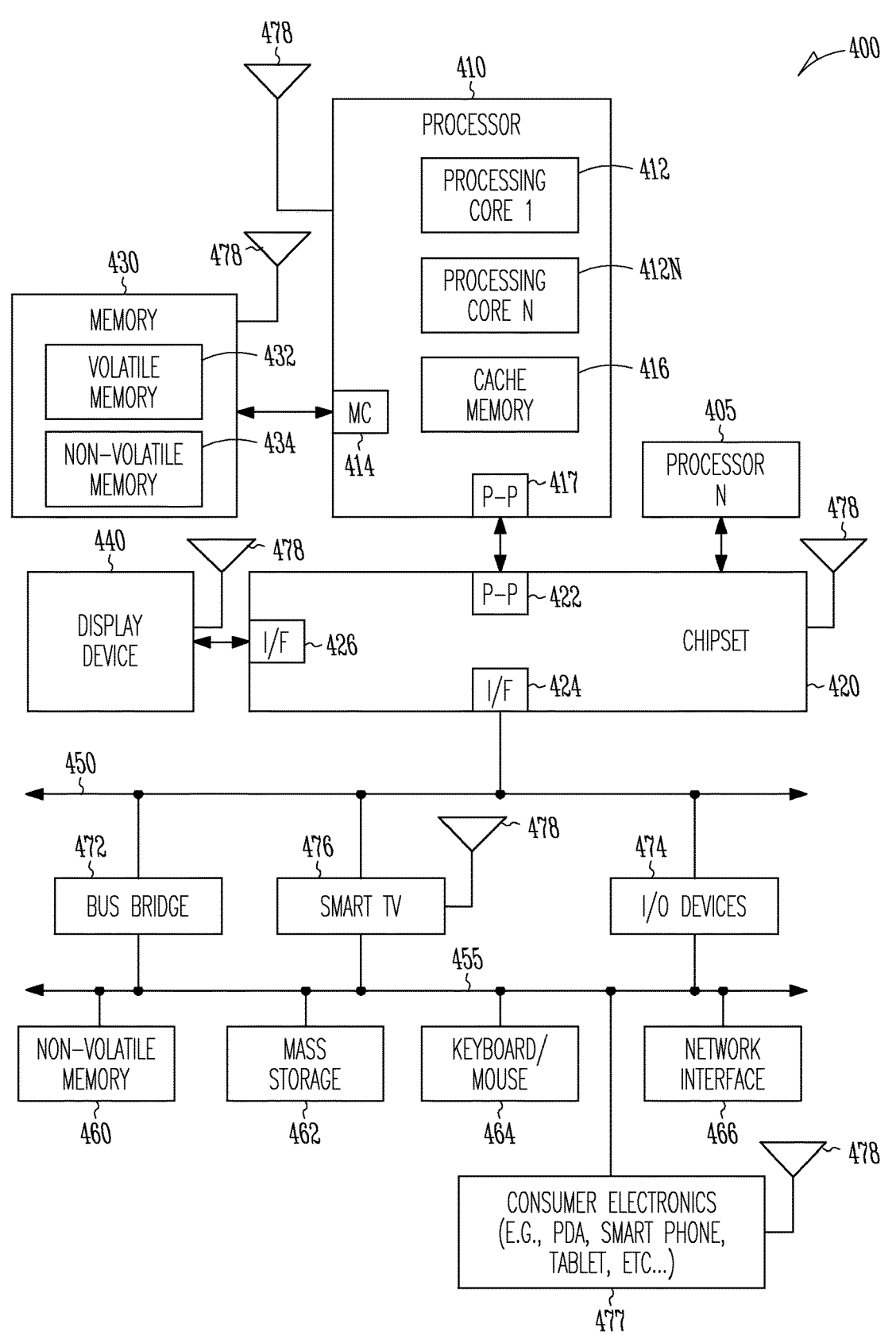
FIG. 4 illustrates a system level diagram in accordance with some embodiments.

FIG. 4 illustrates a system level diagram, according to one embodiment of the invention. For instance, FIG. 4 depicts an example of an electronic device (e.g., system) that can include one or more of interposers (e.g., glass interposers) as described in the present disclosure. In one embodiment, system 400 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 400 is a system on a chip (SOC) system. In one example, two or more systems as shown in FIG. 4 may be coupled together using one or more glass interposers as described in the present disclosure.

In one embodiment, processor 410 has one or more processing cores 412 and 412N, where N is a positive integer and 412N represents the Nth processor core inside processor 410. In one embodiment, system 400 includes multiple processors including 410 and 405, where processor 405 has logic similar or identical to the logic of processor 410. In some embodiments, processing core 412 includes, but is not limited to, pre-fetch logic to fetch instructions, decode logic to decode the instructions, execution logic to execute instructions and the like. In some embodiments, processor 410 has a cache memory 416 to cache instructions and/or data for system 400. Cache memory 416 may be organized into a hierarchal structure including one or more levels of cache memory.

In some embodiments, processor 410 includes a memory controller 414, which is operable to perform functions that enable the processor 410 to access and communicate with memory 430 that includes a volatile memory 432 and/or a non-volatile memory 434. In some embodiments, processor 410 is coupled with memory 430 and chipset 420. Processor 410 may also be coupled to a wireless antenna 478 to communicate with any device configured to transmit and/or receive wireless signals. In one embodiment, the wireless antenna interface 478 operates in accordance with, but is not limited to, the IEEE 802.11 standard and its related family, Home Plug AV (HPAV), Ultra-Wide Band (UWB), Bluetooth, WiMax, or any form of wireless communication protocol.

In some embodiments, volatile memory 432 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 434 includes, but is not limited to, flash memory, phase change memory (PCM), read-only memory (ROM), electrically erasable programmable read-only memory (EEPROM), or any other type of non-volatile memory device.

Memory 430 stores information and instructions to be executed by processor 410. In one embodiment, memory 430 may also store temporary variables or other intermediate information while processor 410 is executing instructions. In the illustrated embodiment, chipset 420 connects with processor 410 via Point-to-Point (PtP or P-P) interfaces 417 and 422. Chipset 420 enables processor 410 to connect to other elements in system 400. In some embodiments of the invention, interfaces 417 and 422 operate in accordance with a PtP communication protocol such as the Intel® QuickPath Interconnect (QPI) or the like. In other embodiments, a different interconnect may be used.

In some embodiments, chipset 420 is operable to communicate with processor 410, 405N, display device 440, and other devices 472, 476, 474, 460, 462, 464, 466, 477, etc. Buses 450 and 455 may be interconnected together via a bus bridge 472. Chipset 420 connects to one or more buses 450 and 455 that interconnect various elements 474, 460, 462, 464, and 466. Chipset 420 may also be coupled to a wireless antenna 478 to communicate with any device configured to transmit and/or receive wireless signals. Chipset 420 connects to display device 440 via interface (I/F) 426. Display 440 may be, for example, a liquid crystal display (LCD), a plasma display, cathode ray tube (CRT) display, or any other form of visual display device. In some embodiments of the invention, processor 410 and chipset 420 are merged into a single SOC. In one embodiment, chipset 420 couples with (e.g., via interface 424) a non-volatile memory 460, a mass storage medium 462, a keyboard/mouse 464, and a network interface 466 via I/F 424 and/or I/F 426, I/O devices 474, smart TV 476, consumer electronics 477 (e.g., PDA, Smart Phone, Tablet, etc.).

In one embodiment, mass storage medium 462 includes, but is not limited to, a solid state drive, a hard disk drive, a universal serial bus flash memory drive, or any other form of computer data storage medium. In one embodiment, network interface 466 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra-Wide Band (UWB), Bluetooth, WiMax, or any form of wireless communication protocol.

While the modules shown in FIG. 4 are depicted as separate blocks within the system 400, the functions performed by some of these blocks may be integrated within a single semiconductor circuit or may be implemented using two or more separate integrated circuits. For example, although cache memory 416 is depicted as a separate block within processor 410, cache memory 416 (or selected aspects of 416) can be incorporated into processor core 412.

The devices, systems, and methods described can provide improved routing of interconnection between ICs for a multichip package in addition to providing improved transistor density in the IC die. Examples described herein include two or three IC dies for simplicity, but one skilled in the art would recognize upon reading this description that the examples can include more than three IC dice.

ADDITIONAL DESCRIPTION AND EXAMPLES

Example 1 includes subject matter (such as an electronic device) comprising multiple integrated circuit (IC) dice disposed on a package substrate, the package substrate having a substrate area; a mold layer that includes the IC dice and multiple conductive pillars extending from a surface of at least one IC die to a first surface of the mold layer; and an interposer layer extending over the carrier layer area and including a stiffening material more rigid than a material of the package substrate. The interposer layer also includes multiple electrically conductive through layer vias contacting the conductive pillars at a first surface of the mold layer and extending through the stiffening material to a second surface of the interposer layer.

In Example 2, the subject matter of Example 1 optionally includes an interposer layer including glass as the stiffener material. The interposer layer is a glass interposer layer and the multiple through layer vias are through-glass vias (TGVs) that include metal.

In Example 3, the subject matter of Example 2 optionally includes an adhesive layer arranged between the mold layer and the glass interposer layer, and the TGVs extend through the adhesive layer to the contact pillars of the mold layer.

In Example 4, the subject matter of one or both of Examples 2 and 3 optionally includes the TGVs including solder on both ends of the TGVs.

In Example 5, the subject matter of one or any combination of Examples 2-4 optionally includes a mold layer including at least one additional contact pillar extending from the first surface of the mold layer to a second opposing surface of the mold layer, and wherein the glass interposer layer includes at least one TGV contacting the at least one additional contact pillar.

In Example 6, the subject matter of one or any combination of Examples 2-5 optionally includes a redistribution layer contacting the glass interposer layer and including at least one electrically conductive interconnect layer in electrical contact with the TGVs.

In Example 7, the subject matter of one or any combination of Examples 2-6 optionally includes a glass interposer layer embedded in a redistribution layer contacting the mold layer and including at least one electrically conductive interconnect layer in electrical contact with the TGVs.

In Example 8, the subject matter of one or any combination of Examples 2-7 optionally includes the glass interposer layer attached to the mold layer using solder.

In Example 9, the subject matter of Example 1 optionally includes an interposer layer including metal as the stiffening material and the interposer layer is a metal interposer layer. The multiple through layer vias include an insulating dielectric material separating the metal of the metal interposer layer and the electrically conductive material of the through layer vias.

Example 10 includes subject matter (such as a method of forming an electronic system) or can optionally be combined with one or any combination of Examples 1-9 to include such subject matter, comprising mounting multiple integrated circuit (IC) dice on a carrier layer, forming a mold layer on the carrier to encapsulate the IC dice, forming multiple conductive pillars in the mold layer that electrically contact at least one IC die and extend to a first surface of the mold layer, and mounting an interposer layer having substantially a same area as the carrier layer on the mold layer and aligning multiple electrically conductive through layer vias of the stiffening layer to the conductive pillars of the mold layer. The interposer layer is comprised of a stiffening material more rigid than a material of the carrier layer and the through layer vias of the stiffening layer extend through the stiffening material to a second surface of the interposer layer.

In Example 11, the subject matter of Example 10 optionally includes mounting a glass interposer layer on the mold layer, and the glass interposer layer includes through glass vias (TGVs) that are seed metallized as the through layer vias, and metalizing the TGVs to connect the TGVs to the conductive pillars of the mold layer.

In Example 12, the subject matter of Example 11 optionally includes aligning the glass interposer layer to the conductive pillars of the mold layer using an adhesive layer, and etching through the adhesive layer prior to metalizing the TGVs.

In Example 13, the subject matter of Example 11 optionally includes aligning the glass interposer layer to the conductive pillars of the mold layer using an adhesive layer, and laser drilling through the adhesive layer prior to metalizing the TGVs.

In Example 14, the subject matter of one or any combination of Examples 11-13 optionally includes forming at least one additional contact pillar in the mold layer extending from the first surface of the mold layer to a second opposing surface of the mold layer, and metalizing at least one TGV of the glass interposer layer to connect the at least one TGV to the at least one additional contact pillar of the mold layer.

In Example 15, the subject matter of one or any combination of Examples 11-14 optionally includes arranging a redistribution layer above the glass interposer layer, and electrically connecting at least one electrically conductive interconnect layer of the redistribution layer to at least one TGV of the glass interposer layer.

In Example 16, the subject matter of one or any combination of Examples 11-15 optionally includes embedding the glass interposer layer in a redistribution layer and arranging the redistribution layer on the mold layer, wherein the redistribution layer includes at least one electrically conductive interconnect layer in electrical contact with at least one TGV of the embedded glass interposer layer.

In Example 17, the subject matter of Example 10 optionally includes mounting a metal interposer layer on the mold layer. The metal interposer layer includes a metal material more rigid than the material of the carrier layer, and multiple through layer vias including an insulating dielectric material separating the metal of the metal interposer layer from seed metallization of the through layer vias.

Example 18 includes subject matter (such as a packaged electronic system) or can optionally be combined with one or any combination of Examples 1-17 to include such subject matter comprising multiple integrated circuit (IC) dice disposed on a package substrate, the carrier layer having a substrate area, a mold layer that includes the IC dice and multiple conductive pillars extending from a surface of at least one IC die to a first surface of the mold layer, a glass interposer layer having substantially a same area as the substrate area and arranged above the mold layer, the glass interposer layer including multiple electrically conductive through glass vias (TGVs) in electrical contact with the conductive pillars and extending through the stiffening material to a second surface of the interposer layer, and an electronic device arranged between the mold layer and the glass interposer layer and in electrical contact with at least two IC dice of the multiple IC dice and in electrical contact with at least one TGV.

In Example 19, the subject matter of Example 18 optionally includes the passive electronic embedded in an insulating layer arranged between the mold layer and the glass interposer layer, and the insulating layer includes through vias and the TGVs of the glass interposer layer are in electrical contact with the conductive pillars of the mold layer through the through vias of the insulating layer.

In Example 20, the subject matter of one or both of Examples 18 and 19 optionally includes a redistribution layer contacting the glass interposer layer and including at least one electrically conductive interconnect layer in electrical contact with the TGVs.

In Example 21, the subject mater of one or any combination of Examples 18-20 optionally includes a die-to-die bridge connector between the at least two IC dice.

These non-limiting examples can be combined in any permutation or combination. The Abstract is provided to allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An electronic device comprising:
   multiple integrated circuit (IC) dice disposed on a package substrate, the package substrate having a substrate area;
   a mold layer that includes the IC dice and multiple conductive pillars extending from a surface of at least one IC die to a first surface of the mold layer; and
   an interposer layer extending over the substrate area and including a stiffening material more rigid than a material of the package substrate, the interposer layer further including multiple electrically conductive through layer vias contacting the conductive pillars at the first surface of the mold layer and extending through the stiffening material to a second surface of the interposer layer, wherein the stiffening material is glass, the interposer layer is a glass interposer layer and the multiple through layer vias are through-glass vias (TGVs) that include metal, wherein the glass interposer layer is embedded in a redistribution layer contacting the mold layer and including at least one electrically conductive interconnect layer in electrical contact with the TGVs.

2. The electronic device of claim 1, including an adhesive layer arranged between the mold layer and the glass interposer layer, and the TGVs extend through the adhesive layer to the conductive pillars of the mold layer.

3. The electronic device of claim 1, wherein each TGV includes solder on both ends of the TGV.

4. The electronic device of claim 1, wherein the mold layer includes at least one additional contact pillar extending from the first surface of the mold layer to a second opposing surface of the mold layer, and wherein the glass interposer layer includes at least one TGV contacting the at least one additional contact pillar.

5. The electronic device of claim 1, including a redistribution layer contacting the glass interposer layer and including at least one electrically conductive interconnect layer in electrical contact with the TGVs.

6. An electronic device comprising:

multiple integrated circuit (IC) dice disposed on a package substrate, the package substrate having a substrate area;

a mold layer that includes the IC dice and multiple conductive pillars extending from a surface of at least one IC die to a first surface of the mold layer; and an interposer layer extending over the substrate area and including a stiffening material more rigid than a material of the package substrate, the interposer layer further including multiple electrically conductive through layer vias contacting the conductive pillars at the first surface of the mold layer and extending through the stiffening material to a second surface of the interposer layer, wherein the stiffening material is a metal more rigid than the package substrate, the interposer layer is a metal interposer layer, and the multiple through layer vias include an insulating dielectric material separating the metal of the metal interposer layer and the electrically conductive material of the through layer vias.

7. The electronic device of claim 1, wherein the glass interposer layer is attached to the mold layer using solder.

8. A packaged electronic system comprising:

multiple integrated circuit (IC) dice disposed on a package substrate, the package substrate having a substrate area;

a mold layer that includes the IC dice and multiple conductive pillars extending from a surface of at least one IC die to a first surface of the mold layer;

a glass interposer layer having substantially a same area as the substrate area and arranged above the mold layer, the glass interposer layer including multiple electrically conductive through glass vias (TGVs) in electrical contact with the conductive pillars and extending through a stiffening material of the glass interposer layer to a second surface of the interposer layer;

an adhesive between the glass interposer layer and the mold layer, the adhesive touching the glass interposer layer; and an electronic device arranged between the mold layer and the glass interposer layer and in electrical contact with at least two IC dice of the multiple IC dice and in electrical contact with at least one TGV, wherein the glass interposer layer is embedded in a redistribution layer contacting the mold layer and including at least one electrically conductive interconnect layer in electrical contact with the TGVs.

9. The packaged electronic system of claim 8, wherein the electronic device is embedded in an insulating layer arranged between the mold layer and the glass interposer layer, and the insulating layer includes through vias and the TGVs of the glass interposer layer are in electrical contact with the conductive pillars of the mold layer through the through vias of the insulating layer.

10. The packaged electronic system of claim 8, including a redistribution layer contacting the glass interposer layer and including at least one electrically conductive interconnect layer in electrical contact with the TGVs.

11. The packaged electronic system of claim 8, wherein the electronic device is a die-to-die bridge connector between the at least two IC dice.

* * * * *